(12) United States Patent
Lai (10) Patent No.: US 7,343,535 B2
(45) Date of Patent: Mar. 11, 2008

(54) EMBEDDED TESTING CAPABILITY FOR INTEGRATED SERIALIZER/DESERIALIZERS

(75) Inventor: Benny W. H. Lai, Fremont, CA (US)

(73) Assignee: Avago Technologies General IP Dte Ltd, Singapore (SG)

( * ) Notice: Subject to any disclaimer, the term of this patent is extended or adjusted under 35 U.S.C. 154(b) by 476 days.

(21) Appl. No.: 10/068,326

(22) Filed: Feb. 6, 2002

(65) Prior Publication Data
US 2003/0149922 A1 Aug. 7, 2003

(51) Int. Cl.
G01R 31/28 (2006.01)
H04B 3/46 (2006.01)

(52) U.S. Cl. ............. 714/724; 714/733; 714/738; 375/224

(58) Field of Classification Search ............. 714/724, 714/733, 734, 738, 739; 375/219, 221, 224
See application file for complete search history.

(56) References Cited

U.S. PATENT DOCUMENTS

| | | | |
|---|---|---|---|
| 3,816,847 A | 6/1974 | Nagao | |
| 4,307,934 A | 12/1981 | Palmer | |
| 4,680,733 A | 7/1987 | Duforestel et al. | |
| 4,847,848 A | 7/1989 | Inoue et al. | |
| 4,966,430 A | 10/1990 | Weidel | |
| 4,993,799 A | 2/1991 | Stein | |
| 5,104,242 A | 4/1992 | Ishikawa | |
| 5,195,156 A | 3/1993 | Freeman et al. | |
| 5,390,271 A | 2/1995 | Priest | |
| 5,394,490 A | 2/1995 | Kato et al. | |
| 5,485,021 A | 1/1996 | Abe | |
| 5,512,860 A | 4/1996 | Huscroft et al. | |
| 5,513,289 A | 4/1996 | Hosokawa et al. | |
| 5,532,524 A | 7/1996 | Townsley et al. | |
| 5,552,918 A | 9/1996 | Krug et al. | |
| 5,565,672 A | 10/1996 | Siegel et al. | |
| 5,566,265 A | 10/1996 | Spaeth et al. | |
| 5,577,142 A | 11/1996 | Mueller-Fiedler et al. | |

(Continued)

FOREIGN PATENT DOCUMENTS

EP 1104113 5/2001

(Continued)

OTHER PUBLICATIONS

Agilent Technologies, Inc., Technical Data sheet, "Gigabit Ethernet and Fibre Channel SerDes ICs," Apr. 2000.

(Continued)

*Primary Examiner*—Cynthia Britt
*Assistant Examiner*—John J. Tabone, Jr.

(57) ABSTRACT

Testing capability for an integrated circuit having more than one serializer/deserializer (SERDES) block includes embedding a tester within each block, so that the blocks can be tested independently and concurrently. In one embodiment, a tester includes a functional test controller (FTC) for mode setting and a functional test interface (FTI) for implementing the test procedures. The FTI of each tester is inserted between the SERDES of the same block and core processing logic that is also embedded within the integrated circuit. The FTCs are all interconnected via a test bus that is connected to an input/output controller (IOC) for communication between the testers and an external source, such as a personal computer. Optionally, a built-in-self-tester (BIST) state machine is connected to the test bus.

16 Claims, 4 Drawing Sheets

U.S. PATENT DOCUMENTS

| | | | |
|---|---|---|---|
| 5,578,863 A | 11/1996 | De Poorter | |
| 5,602,855 A | 2/1997 | Whetsel, Jr. | |
| 5,665,982 A | 9/1997 | Torikai | |
| 5,742,833 A | 4/1998 | Dea et al. | |
| 5,781,422 A | 7/1998 | Lavin et al. | |
| 5,801,402 A | 9/1998 | Shin | |
| 5,822,352 A | 10/1998 | Mizutani et al. | |
| 5,835,514 A | 11/1998 | Yuen et al. | |
| 5,867,620 A | 2/1999 | Bunin et al. | |
| 5,875,205 A | 2/1999 | Spaeth et al. | |
| 5,883,988 A | 3/1999 | Yamamoto et al. | |
| 5,912,872 A | 6/1999 | Feldman et al. | |
| 5,940,564 A | 8/1999 | Jewell | |
| 5,956,370 A * | 9/1999 | Ducaroir et al. | 375/221 |
| 5,981,945 A | 11/1999 | Spaeth et al. | |
| 5,998,982 A | 12/1999 | Groeneveld et al. | |
| 6,016,548 A | 1/2000 | Nakamura et al. | |
| 6,036,872 A | 3/2000 | Wood et al. | |
| 6,037,641 A | 3/2000 | Goel | |
| 6,047,380 A | 4/2000 | Nolan et al. | |
| 6,079,025 A | 6/2000 | Fung | |
| 6,085,048 A | 7/2000 | Mikoshiba et al. | |
| 6,085,328 A | 7/2000 | Klein et al. | |
| 6,089,456 A | 7/2000 | Walsh et al. | |
| 6,115,763 A * | 9/2000 | Douskey et al. | 710/72 |
| 6,144,787 A | 11/2000 | Johnston et al. | |
| 6,187,211 B1 | 2/2001 | Smith et al. | |
| 6,201,829 B1 * | 3/2001 | Schneider | 375/221 |
| 6,228,675 B1 | 5/2001 | Ruby et al. | |
| 6,230,277 B1 | 5/2001 | Nakaoka et al. | |
| 6,234,687 B1 | 5/2001 | Hall et al. | |
| 6,243,508 B1 | 6/2001 | Jewell et al. | |
| 6,265,246 B1 | 7/2001 | Ruby et al. | |
| 6,274,890 B1 | 8/2001 | Oshio et al. | |
| 6,275,513 B1 | 8/2001 | Chang-Hasnain et al. | |
| 6,303,922 B1 | 10/2001 | Kasper | |
| 6,354,747 B1 | 3/2002 | Irie et al. | |
| 6,376,280 B1 | 4/2002 | Ruby et al. | |
| 6,416,238 B1 | 7/2002 | Gilliland et al. | |
| 6,422,766 B1 | 7/2002 | Althaus et al. | |
| 6,429,511 B2 | 8/2002 | Ruby et al. | |
| 6,460,143 B1 | 10/2002 | Howard et al. | |
| 6,540,412 B2 | 4/2003 | Yonemura et al. | |
| 6,556,608 B1 | 4/2003 | Gilliland et al. | |
| 6,567,439 B1 | 5/2003 | Auracher et al. | |
| 6,567,590 B1 | 5/2003 | Okada et al. | |
| 6,599,666 B2 | 7/2003 | Rolfson | |
| 6,608,476 B1 | 8/2003 | Mirov et al. | |
| 6,652,158 B2 | 11/2003 | Bartur et al. | |
| 6,684,033 B1 | 1/2004 | Doh et al. | |
| 6,686,580 B1 | 2/2004 | Glenn et al. | |
| 6,731,882 B1 | 5/2004 | Althaus et al. | |
| 6,757,308 B1 | 6/2004 | Eldring et al. | |
| 6,759,723 B2 | 7/2004 | Silverbrook | |
| 6,774,404 B2 | 8/2004 | Imai | |
| 6,777,263 B1 | 8/2004 | Gan et al. | |
| 6,787,897 B2 | 9/2004 | Geefay et al. | |
| 6,801,196 B1 | 10/2004 | Bodley et al. | |
| 6,905,618 B2 | 6/2005 | Matthews et al. | |
| 6,919,222 B2 | 7/2005 | Geefay | |
| 6,956,992 B2 | 10/2005 | Coleman | |
| 6,979,810 B2 | 12/2005 | Chujo et al. | |
| 6,980,823 B2 | 12/2005 | Challa et al. | |
| 7,134,032 B2 | 11/2006 | Yamada et al. | |
| 2001/0023920 A1 | 9/2001 | Ando et al. | |
| 2002/0008326 A1 | 1/2002 | Mizusaki | |
| 2002/0101641 A1 | 8/2002 | Kurchuk | |
| 2002/0152408 A1 | 10/2002 | Inui et al. | |
| 2002/0179921 A1 | 12/2002 | Cohn | |
| 2003/0023912 A1 * | 1/2003 | Lesea | 714/726 |
| 2003/0035473 A1 * | 2/2003 | Takinosawa | 375/224 |
| 2003/0071283 A1 | 4/2003 | Heschel | |
| 2003/0089902 A1 | 5/2003 | Yue | |
| 2003/0116825 A1 | 6/2003 | Geefay | |
| 2003/0119308 A1 | 6/2003 | Geefay | |
| 2003/0142914 A1 | 7/2003 | Jewell et al. | |
| 2003/0160256 A1 | 8/2003 | Durocher et al. | |
| 2004/0086011 A1 | 5/2004 | Bhandarkar | |
| 2004/0190836 A1 | 9/2004 | Kilian | |
| 2005/0019042 A1 | 1/2005 | Kaneda | |
| 2005/0052255 A1 | 3/2005 | Chiang | |
| 2005/0058222 A1 | 3/2005 | Black et al. | |
| 2005/0134349 A1 | 6/2005 | Krishnaswami | |
| 2005/0191059 A1 | 9/2005 | Swenson et al. | |
| 2006/0115280 A1 | 6/2006 | Chang | |
| 2007/0019966 A1 | 1/2007 | Chiu et al. | |
| 2007/0047963 A1 | 3/2007 | Dallesasse | |
| 2007/0127929 A1 | 6/2007 | Nishihara | |
| 2007/0154147 A1 | 7/2007 | Weem | |
| 2007/0154225 A1 | 7/2007 | Schilz | |
| 2007/0166047 A1 | 7/2007 | Berger | |
| 2007/0206964 A1 | 9/2007 | Lee et al. | |

FOREIGN PATENT DOCUMENTS

| | | |
|---|---|---|
| EP | 1187373 A2 | 3/2002 |
| EP | 1199697 | 4/2002 |
| EP | 1187373 A3 | 1/2005 |
| JP | 2007/020008 | 1/2007 |
| WO | WO-98/50810 A1 | 11/1998 |
| WO | WO-01/01497 | 1/2001 |

OTHER PUBLICATIONS

"English translation of German Office Action involving counterpart Germann Patent Application No.", 102004026990, (Feb. 21, 2007), 4-54.

Lee, Chien C., et al., "Silicon-Based Transmissive Diffractive Optical Element", *Optics Letters*, Vol. 28, No. 14, *Optical Society of America*, (Jul. 15, 2003), 1260-1262.

"English Translation of German Office Action involving counterpart German Patent Application", No. 102004025775, (Feb. 16, 2007), 2-54.

"English translation of German Office Action; involving counterpart German Patent Application", No. 10 2004 028 117, (Nov. 2, 2006), 3-54.

"English translation of German Office Action; involving German Patent", No. 10 2004 028 117, (Mar. 20, 2007), 3-54.

Pallotta, Andrea et al., "A Low-Power Clock and Data ecovery Circuit for 2.5 Gb/s SDH Receivers", *ISLPED, Rapallo, Itlay*, (2000), 67-72.

Takeshita, T. "A 622Mb/s Fully-Intergrated Optical IC with a Wide Range Input", *IEEE, International Solid-State Circuits Conference*, (2002).

Sklar, B. "Digital Communications: Fundamentals and Applications", 2nd Ed., *Upper Saddle River, NJ: Prentice Hall PTR*, (2001).

Sialm, et al., "Ultra-Fast CMOS Transceiver Design for Optical Interconnect Applications", *Website*: www.ife.ee.ethz.ch/rfic/_Link:_19_Gbit/s_Optolink.

Pepeljugoski, P. et al., "Improved Performance of 10 GB/s Multimode Fiber Optic Links Using Equalization", *Optical Fiber Communications Conference, OFC* 2003, Vol. 2., (Mar. 23-28, 2003), 472-474.

\* cited by examiner

EMBEDDED TESTING CAPABILITY FOR INTEGRATED SERIALIZER/DESERIALIZERS

TECHNICAL FIELD

The invention relates generally to integrated serializer/deserializers and more particularly to techniques for testing the performances of such components.

BACKGROUND ART

A serializer/deserializer (SERDES) may be used as a transceiver within a network environment. The transmitter section of a SERDES accepts a parallel data word (which is typically 8-bit/10-bit encoded) and provides multiplexing into a single data stream having a transmission rate that is ten times the parallel rate. Conventionally, the outgoing parallel data is latched into the input register of the transmitter on the rising edge of a reference clock, but is serialized and transmitted at a speed of approximately ten times the reference clock. The high speed serial output may be connected to a copper cable for electrical transmission or may be converted to optical signals for transmission via a fiber optic cable.

The receive section of a SERDES recovers original 10-bit wide parallel data. That is, the received section is a deserializer. This section may employ a phase-locked loop (PLL) to determine the clocking for the recovered data. Clock recovery may be achieved by locking onto the frequency of the reference clock and by phase locking onto the incoming data stream.

Originally, the serializer was fabricated as one integrated circuit (IC) chip, while the deserializer was formed as a separate IC chip. In a first round of integration, the serialization function block and deserialization function block were integrated into a single IC chip. The motivations for the integration included reducing the total chip count and reducing the required board real estate. The same motivations applied to a second round of integration in which multiple SERDESs were incorporated into a single IC chip. As a third round of integration, application-specific circuitry may be embedded with the multiple SERDESs. For example, the circuitry of a switch logic chip may be integrated into the SERDES chip, thereby removing the necessity of providing parallel data lines which connect a switch logic chip to a SERDES chip. In addition to preserving board real estate, significant reductions in required power are realized at this level of integration.

Potential concerns that are raised by the integration of SERDES-related circuitry into a single IC chip include determining a testing approach that is sufficiently thorough. Preferably, each SERDES within a highly integrated chip is individually tested and the different components of each SERDES are tested at their different specific speeds to ensure proper functionality. During testing, the parallel data at the serializer input (i.e., Tx input) is dynamically toggled and the recovered data at the deserializer input (i.e., Rx input) is compared to the transmitted data. The tests are executed over various modes, such as a loop-back mode and a byte-sync enable mode. A functional test at the specific speed ensures that the signal integrity of the output drivers and the subtle behaviors of the PLLs are all tested.

The stimuli and measurements of the data may be provided and performed using an external high-speed IC test system. One test system is referred to as the Bit-Error-Rate Tester (BERT). The BERT generates pseudo-random bit sequence (PRBS) patterns and continuously monitors the received PRBS patterns for errors. A high volume of data is channeled through a SERDES by a BERT, which records any errors in order to determine the bit error rate. Since the parallel signals which interface the embedded SERDESs with the embedded core logic, such as switch core logic, are internal to highly integrated IC chips, the traditional methods of testing are difficult or impossible to apply. Thus, what is needed is a method of testing the SERDES circuitry within a highly integrated IC chip.

Particularly where a SERDES utilizes analog functionality (such as within its PLLs), the SERDES is sensitive to crosstalk and power supply variations. Thus, testing the functionality of a single embedded SERDES channel does not ensure that the SERDES which supports that channel will function properly when all of its channels are active. It follows that proper testing requires all embedded SERDESs to be operating simultaneously.

What is needed is a multiple-SERDES testing capability that can be applied to highly integrated IC chips, with the testing being adapted to simulate a real-time environment of operation.

SUMMARY OF THE INVENTION

An integrated circuit includes a number of serializer/deserializers (SERDESs) and embedded testers which allow individual testing of each SERDES. In one embodiment, each tester includes a functional test controller (FTC) and a functional test interface (FTI). A particular FTI is dedicated to one SERDES, with the FTC of the same tester being enabled to control modes of either or both of the FTI and the SERDES. The FTCs are individually addressable and may be accessed by an embedded input/output controller. The FTIs, FTCs and the input/output controller are coupled to a common test bus through which signals are exchanged. The input/output controller is also connected to an output, such as a serial port, that enables the controller to receive and transmit signals to and from an external source, such as a personal computer.

As one implementation of the invention, each FTI is connected between the operatively associated SERDES and core processing logic that is also embedded within the integrated circuit. As a result, the FTI can intercept the parallel data that is transmitted in either direction and can perform the functions of loop-back testing, static data testing and dynamic data testing. The FTI may include a test pattern generator (such as a PRBS generator) connected to the parallel data inputs of the associated SERDES and may include an error detector connected to the parallel data outputs of the same SERDES.

The common test bus structure and the unique addresses of the FTIs allow an external source to access the parallel signals of an individual SERDES and to control the mode of the SERDES. Moreover, static data testing can be enabled by setting the SERDES in the loop-back mode and comparing the received parallel data to anticipated bits. This test can be used to identify processing defects, such as metal shorts.

To perform full functional testing at the specific speed that will be encountered in actual use, the test pattern generator and the error detector of a particular FTI may be utilized. In one embodiment, the test pattern generator is a conventional arrangement that utilizes seven flip-flops and one Xor gate to generate a $2^7-1$ sequence at the serial rate. Since the requirement is to direct a 10-bit pattern into the transmit parallel inputs, the output of the seven flip-flop generator can be demultiplexed 1 to 10. However, this technique requires significant power. An alternative approach to generating the equivalent 10 bits at the parallel rate is preferred. This can be achieved by embedding a pattern generator having 10 flip-flops and 10 Xor gates. However, other approaches may be employed.

Regarding the embedded error detector, an identical 10-bit generator may be used, so that the bit sequence is derived from known states. Thus, the received parallel data can be "seeded" onto the pattern generator of the error detector. During the seeding process, it is assumed that the 10-bit loading is error free, so that any inconsistencies that are detected may be counted as errors introduced within the SERDES. The errors may be stored in a local register within the FTI or FTC for later polling from the external source through the input/output controller.

In one embodiment of an embedded bit error rate tester (BERT), patterns such as 1010101010 and 1100110011 and their complements may be toggled. These toggling patterns may be used to expose weaknesses of the SERDES that would result from induced power supply variations.

An advantage of the invention is that the SERDES blocks can be addressed, controlled and monitored independently. As another optional feature, the integrated circuit may include an embedded built-in-self-tester (BIST) that is used for the static data testing. As another advantage of the invention, by embedding the test pattern generators and error detectors within the integrated circuit, the entire chip can be exercised at its nominal operating bit rate. The system allows all the SERDES blocks to be operating simultaneously, while each SERDES bit error rate is individually identified. Yet another advantage is that the self-seeding error detection method provides the ability to synchronize to an external PRBS pattern that is unrelated to the transmitter section of a SERDES. As examples, the PRBS pattern can be generated with an external BERT or other chips with embedded SERDESs.

DETAILED DESCRIPTION

Figure 1:
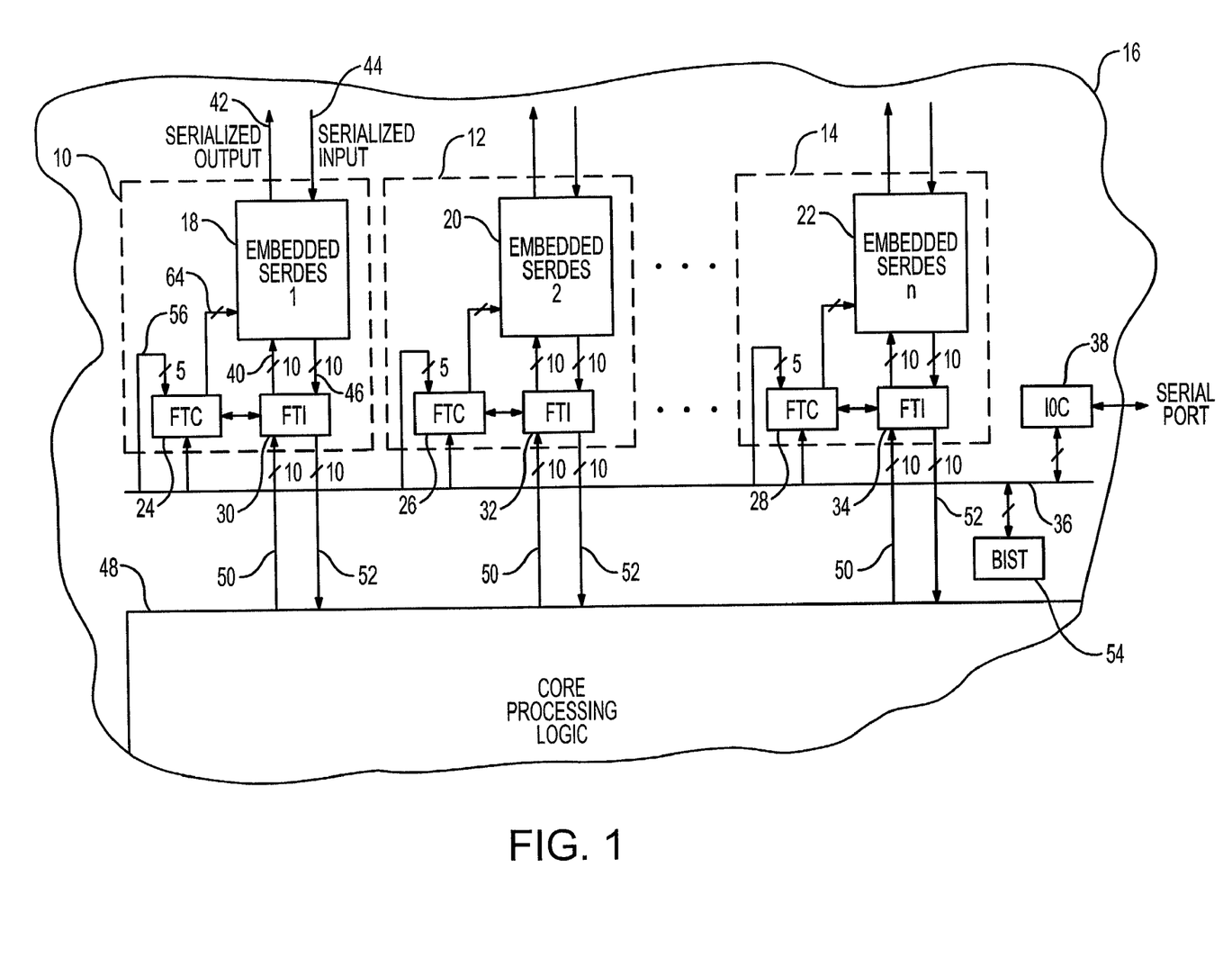
FIG. 1 is a block diagram of an integrated circuit having multiple SERDESs and on-chip testers in accordance with the invention.

With reference to FIG. 1, an arrangement of n SERDES blocks 10, 12 and 14 is shown as being fabricated on a substrate 16, which may be a semiconductor substrate, such as a silicon die. In one embodiment, four SERDES blocks (n=4) are embedded onto the substrate. Each SERDES block includes a SERDES 18, 20 and 22 and a tester. Each tester is defined by a functional test controller (FTC) 24, 26 and 28 and a functional test interface (FTI) 30, 32 and 34.

Each of the FTCs is connected to a test bus 36, which may be used to transmit and receive data and commands. Also connected to the test bus is an input/output controller (IOC) 38, which is coupled to a serial port in order to allow the testing capability to communicate with an external (i.e., off-chip) device, such as a personal computer used for the testing process. The serial port may be an RS232 interface, but other techniques for communicating with external devices may be substituted for the serial port.

The SERDESs may be conventional serializer/deserializers. The structure of such components will not be described herein. A SERDES is used to convert data at parallel data inputs to a stream of serial data and to convert incoming serialized data to parallel data. For example, with regard to the SERDES 18, parallel data at an arrangement of inputs 40 is converted to a stream of serial data which is transmitted via output 42, while incoming serialized data received via input 44 is converted to parallel data that is directed to its parallel data outputs 46. The serialized data is transmitted at a speed of ten times the reference clock for manipulating the parallel data. Circuitry for implementing the conversions is known in the art.

Also embedded within the integrated circuit is core processing logic 48. At least a portion of the core processing logic is designed to manipulate parallel data. The core processing logic may be application specific and may include a central processing unit (CPU), but this is not critical. As will be explained more fully below, when the FTIs 30, 32 and 34 are set in normal-operation modes by the FTCs 24, 26 and 28, parallel data which is directed along data lines 50 from the core processing logic transparently passes through the associated FTI to the inputs 40 of the associated SERDES. Similarly, the normal-operation mode of the FTI allows parallel data from data lines 46 to pass through the FTI to the input transmission lines 52 of the core processing logic. In addition to the normal-operation mode, the FTIs 30, 32 and 34 may be set by the FTCs 24, 26 and 28 into one or more test modes. Each FTC is connected to both the associated FTI and the associated SERDES 18, 20 and 22 to enable mode setting of each of the two components. Mode-setting commands are received from either the IOC 38 or an optional built-in-self-test (BIST) state machine 54. The BIST state machine is also integrally formed on the substrate 16.

The goals of the testing procedure include:
(1) controlling the transmitter (Tx) parallel data and modes of each SERDES 18, 20 and 22,
(2) measuring the parallel data and status at each receive section (Rx) of the SERDESs,
(3) performing functional tests at the specified speed of each SERDES,
(4) enabling concurrent running of the testing of the embedded SERDESs, so that the effects of crosstalk and power supply variations may be detected, and
(5) enabling continuous monitoring of the bit error rate performance of each SERDES.

Figure 2:
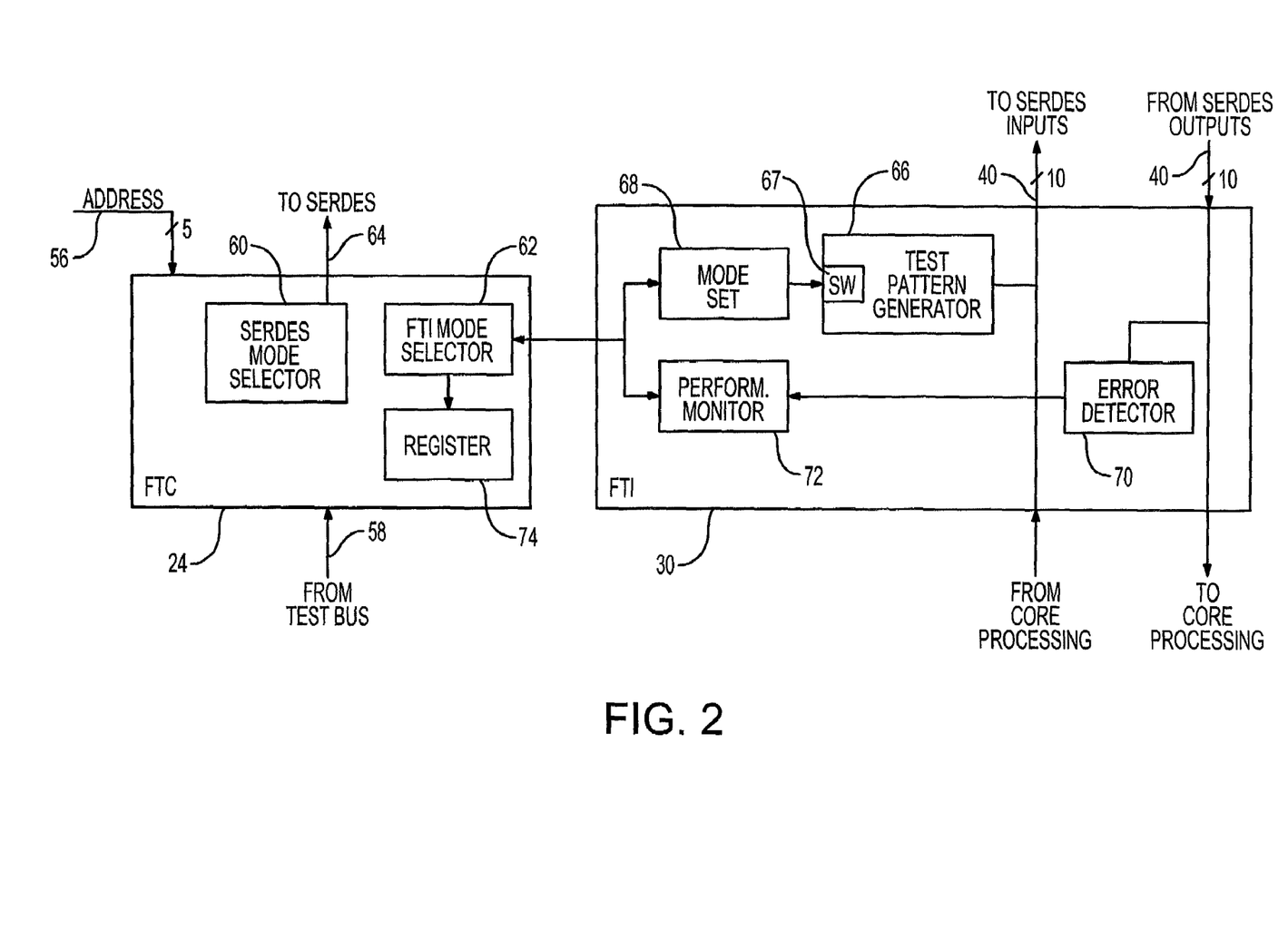
FIG. 2 is a block diagram of one of the testers of FIG. 1.

Referring now to FIG. 2, each FTC 24 is assigned a unique address. As one example, the addresses may be 5-bit addresses that are received via an address line 56 that is separate from the main communication line 58 between the test bus 36 and the FTC. The FTC is configured to interpret the commands on the common test bus and includes a SERDES mode selector 60 and an FTI mode selector 62. As is known in the art, a conventional SERDES often includes on-chip local loop-back functionality that is controlled through access via an external input pin. In FIGS. 1 and 2, an embedded mode-setting line 64 is the functional equivalent of the conventional external pin. It is also known to allow the byte synchronization feature of a SERDES to be disabled externally. The SERDES mode selector 60 may be used to trigger a signal that disables the bit-synchronization feature of the associated SERDES.

In operation, the addressing, control instructions and data are transmitted onto the common test bus 36 to all of the FTC blocks 24, 26 and 28 by the IOC 38. Commands and addresses are interpreted by the FTCs, which control the FTIs 30, 32 and 34 accordingly. The FTCs also are able to set the mode of the embedded SERDESs 18, 20 and 22. The common test bus can also be accessed by the BIST state machine 54.

The common test bus structure 36 allows an external device, such as a personal computer, to monitor performance of parallel data transmissions within the integrated circuit 16. The test structure alone can be used to perform static data testing, wherein static data is set at each of the parallel inputs 40 of each SERDES, which is engaged within the loop-back mode, so that the bits at the parallel outputs 46 of the SERDES can be compared with anticipated bits. The resulting comparison test can often identify existing gross processing defects, such as metal shorts.

A full functional test at the normal operational speed of the SERDES may be performed using a test pattern generator 66 within the FTI 30. When a mode set component 68 of the FTI is controlled by the associated FTC 24 to disable the test pattern generator 66 by operation of a switching device 67, the flow of data through the FTI is transparent. That is, the position of the FTI does not affect the flow of data between the core processing logic 48 and a cooperating SERDES 18, 20 or 22. However, when the mode set component 68 of the FTI is controlled to enable the test pattern generator 66 by activating the switching device 67, signals are directed to the parallel lines 40 from the test pattern generator. While not critical, the test pattern generator may provide conventional $2^7-1$ PRBS sequencing.

The FTI 30 of FIG. 2 preferably includes a number of different operational modes. A normal-operation mode allows parallel data to transparently pass through the FTI. A loop-back mode causes the parallel Rx outputs 46 of the associated SERDES to be wrapped back to the Tx parallel inputs 40 of the same SERDES. This may be referred to as "serial loop-back," since the serial data from the Rx high-speed input is transmitted back to the Tx serial high-speed output. The static-test mode was previously described. In a dynamic-test mode, a dynamic pattern, such as the $2^7-1$ PRBS pattern is provided by the test pattern generator. As shown in FIG. 2, the FTI 30 includes an error detector 70 and a performance monitor 72. As an example of the error detector, a received pattern can be compared with an anticipated pattern, with error discrepancies being counted and stored by cooperation with the performance monitor 72. Optionally, the FTC 24 includes a local register 74 which can be polled by an external source via the IOC 38 of FIG. 1.

Figure 3:
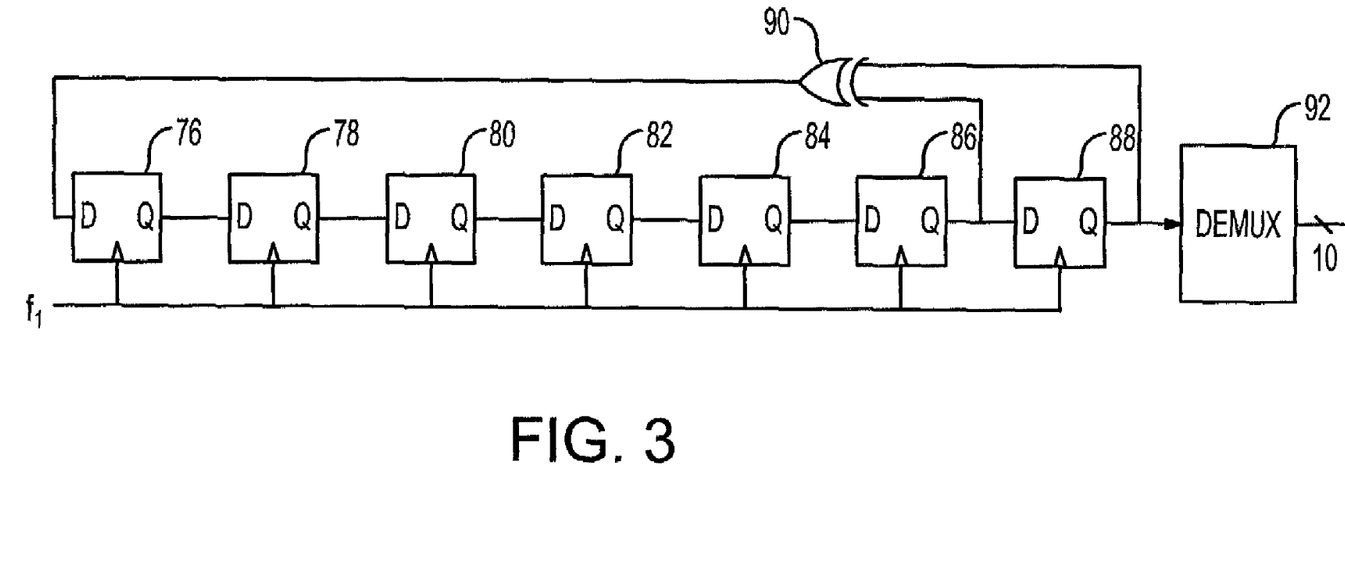
FIG. 3 is one embodiment of a test pattern generator that may be used in the tester of FIG. 2.

One embodiment of a possible test pattern generator 66 is shown in FIG. 3. In this embodiment, a $2^7-1$ PRBS sequence is generated at a serial rate using seven flip-flops 76, 78, 80, 82, 84, 86 and 88, as well as one Xor gate 90. The flip-flops are D-type devices having operations well known in the art. A high-speed clock signal ($f_1$) is connected to the clock inputs of the flip-flops. The output of each flip-flop is connected to the input of the following flip-flop in the succession of devices, until the last flip-flop 88 has an output that provides the desired pattern at the serial rate of the high-speed clock. The Xor gate 90 receives the outputs from the final two flip-flops 86 and 88 and is connected to the input of the first flip-flop 76. Therefore, the output pattern is a repeating one. Since the present application requires a 10-bit pattern to be directed into the Tx parallel inputs of the operatively associated SERDES, a 1 to 10 demultiplexer 92 is included.

While the embodiment of FIG. 3 generates the 10-bit parallel $2^7-1$ sequencing, it lacks power conservation. All seven flip-flops, as well as the demultiplexer, must run at the high-speed serial rate. Therefore, the embodiment is best suited for applications in which power conservation during the testing process is not a significant issue.

Figure 4:
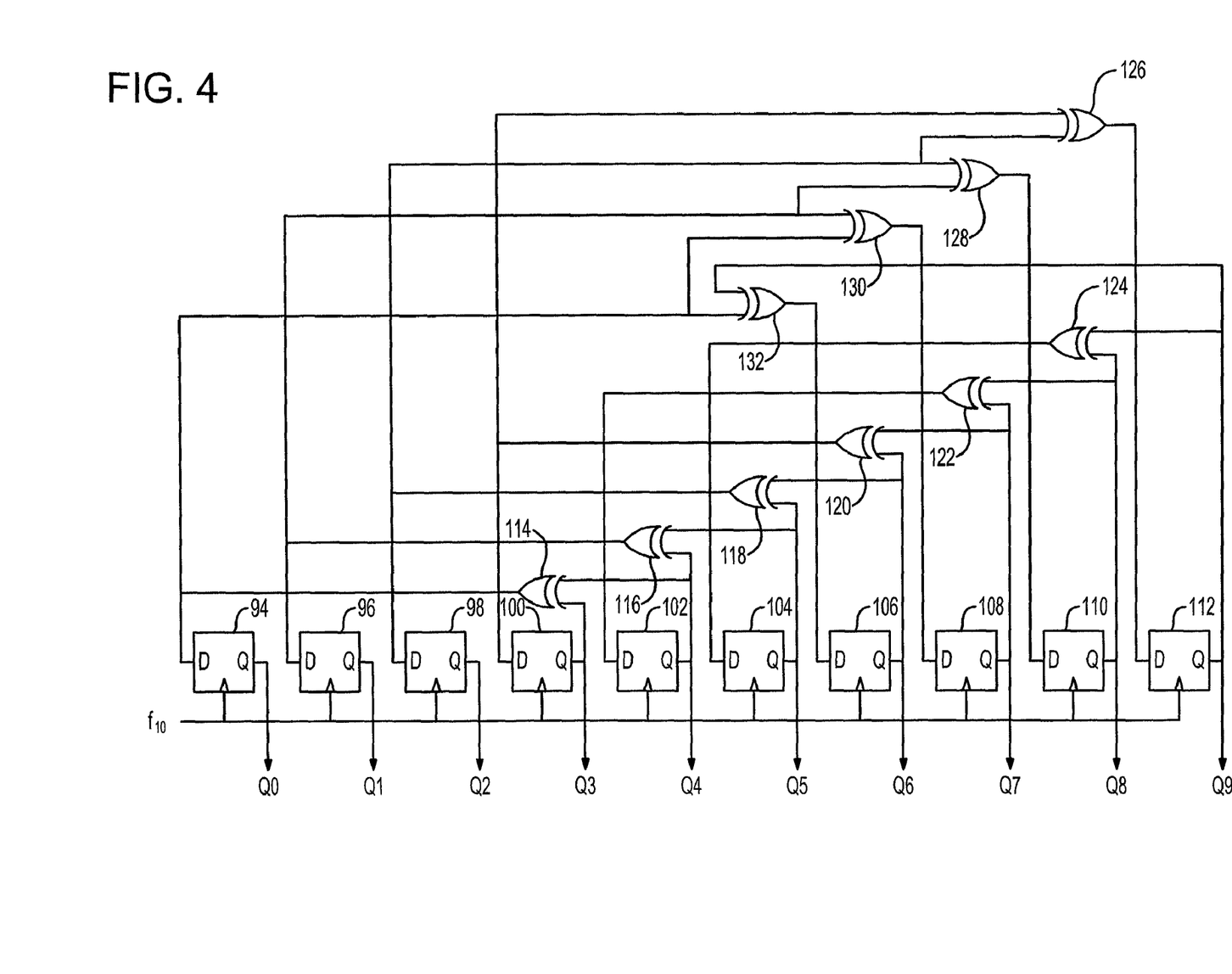
FIG. 4 is a second embodiment of a test pattern generator that may be used in the tester of FIG. 2.

An alternative test pattern generator is shown in FIG. 4. In this embodiment, the 10 bits of the pattern are generated at the slower parallel rate ($f_{10}$). Serialization of the 10 bits provides the standard $2^7-1$ pattern. This embodiment utilizes 10 flip-flops 94, 96, 98, 100, 102, 104, 106, 108, 110 and 112. The test pattern generator also includes 10 Xor gates 114, 116, 118, 120, 122, 124, 126, 128, 130 and 132. The state equations for the circuit are shown in Table 1, but as will be recognized by persons skilled in the art, optimization is possible using available techniques. The data in (D) for the first flip-flop 94 at a given time n is a function of the outputs Q3 and Q4 at the previous clock cycle (n−1). Similarly, because of the connection to the Xor gate 116, the data in (D96) at the second flip-flop is a function of flip-flop outputs Q4 and Q5 at the previous clock cycle. For the final flip-flop 112, the data in (D112) at clock cycle n is a function of the data inputs D98 and D100 at the same clock cycle. While this embodiment has advantages over the embodiment of FIG. 3, other test pattern generators may be substituted.

TABLE 1

D94 (n) = Q3 (n − 1) ⊕ Q4 (n − 1)
D96 (n) = Q4 (n − 1) ⊕ Q5 (n − 1)
D98 (n) = Q5 (n − 1) ⊕ Q6 (n − 1)
D100 (n) = Q6 (n − 1) ⊕ Q7 (n − 1)
D102 (n) = Q7 (n − 1) ⊕ Q8 (n − 1)
D104 (n) = Q8 (n − 1) ⊕ Q9 (n − 1)
D106 (n) = Q9 (n − 1) ⊕ D94 (n)
D108 (n) = D94 (n) ⊕ D96 (n)
D110 (n) = D96 (n) ⊕ D98 (n)
D112 (n) = D98 (n) ⊕ D100 (n)

Referring again to FIG. 2, the error detector 70 may be connected to the test pattern generator 66, so that a direct comparison can be made between the bits that are transmitted along the parallel data lines 40 and the bits that are received along parallel data lines 46. A concern with this technique is that the delay of the pattern transmission may not be predictable. The unpredictability of the direct comparison technique potentially renders the entire process unreliable. Therefore, the use of direct comparison should be limited to applications in which delay and similar factors are predictable.

To overcome the concerns with the direct comparison technique, the error detector 70 may be formed to include a second 10-bit PRBS generator that is identical to the one of the test pattern generator 66. Since the generated bit sequences are derived from known states, the received parallel data can be seeded onto the pattern generator of the error detector. During this seeding process, it is assumed that the pattern generated by the error detector is error-free. This assumption is acceptable, since one error in ten consecutive bits is extremely low when the bit error rate (BER) is below one in one billion.

The performance monitor 72 counts errors, which may be stored in a local register within the FTI 30. Alternatively or additionally, the FTC 24 includes a local register 74 for storing error information. The error information may be polled by an external personal computer through the IOC 38 of FIG. 1.

Either the individual FTIs 30, 32 and 34 or the BIST 54 may include the capability of toggling patterns, such as 1010101010 and 1100110011 and their complements. Monitoring the BER during the toggling of such patterns can be used to expose weaknesses of the SERDES block 10, 12 and 14 as a result of induced power supply variations.

In the fabrication of the integrated circuit of FIG. 1, conventional integrated circuit fabrication techniques are employed. An insulation is then used to encase the integrated circuit, again using techniques well known in the art. A packaged integrated circuit chip is thereby formed to include input/output connections which enable connectivity to other chips and the like.

What is claimed is:

1. An integrated circuit comprising:
a plurality of serializer/deserializers (SERDESs);
core processing logic integrated with each of said plurality of SERDESs and connected to each of said plurality of SERDESs to exchange signals therewith; and
a plurality of functionally identical testers integrated with said plurality of SERDESs and said core processing logic, said testers being connected to individually test each of said plurality of SERDESs, each of said testers being enabled to detect performance characteristics of an individual one of said plurality of SERDESs independently of other said testers and concurrently with said plurality of SERDESs, wherein a bit error rate for each of said plurality of SERDESs is individually identified, and wherein said testers perform loop-back testing, static data testing and dynamic data testing;
wherein each of said testers is connected to a common test bus that is integrated with said plurality of SERDESs and said testers, said common test bus being separate from a data bus, each of said testers having a unique address that enables independent accessibility of each of said testers via said test bus, said test bus being dedicated to providing signaling for said enablement to detect performance characteristics of said individual one of said plurality of SERDESs and further comprising a built in self-test (BIST) state machine integrated with said plurality of SERDESs and said testers, said BIST being connected to said test bus and being configured to sequence test operations by each of said testers.

2. The integrated circuit of claim 1 further comprising a semiconductor substrate on which said plurality of SERDESs, said core processing logic and said testers are fabricated.

3. The integrated circuit of claim 1 wherein each of said testers includes a test controller and a test interface, each of said testers being dedicated to said individual one of said plurality of SERDESs, said test interface of each of said testers being coupled between said core processing logic and said SERDES to which said each of said testers is dedicated, said tester controller being configured to select among a normal operation mode and a plurality of test modes for operation of said test interface.

4. The integrated circuit of claim 3 wherein said test interface includes a test pattern generator that is connected to inputs of parallel data of each of said plurality of SERDESs to which said test interface is dedicated, said test interface further including an error detector connected to outputs of parallel data from each of said plurality of SERDESs.

5. The integrated circuit of claim 1 further comprising an input/output tester controller integrated with said plurality of SERDESs said testers, said input/output tester controller being coupled between said test bus and an output of said integrated circuit for signal communication with an external source for sequencing test operations.

6. The integrated circuit of claim 1 wherein said testers are responsive to individual commands and are configured to be individually but concurrently operated, said testers having a one-to-one correspondence with said plurality of SERDESs.

7. An integrated circuit comprising:
a single semiconductor substrate onto which integrated circuitry is fabricated;
core circuitry integrated onto said substrate;
a plurality of SERDESs integrated onto said substrate, each of said plurality of SERDESs having parallel data inputs and parallel data outputs and having serial data inputs and outputs;
a plurality of functional test interfaces (FTIs) integrally formed with said substrate, each of said FTIs being uniquely associated with a one of said SERDESs and being connected to said parallel data inputs and outputs of said associated one of said SERDESs, each of said FTIs being enabled to individually and concurrently test performances of each of said plurality of SERDESs wherein a bit error rate for each of said plurality of SERDESs is individually identified, and wherein said FTIs reform loop-back testing, static data testing and dynamic data testing;
a plurality of functional test controllers (FTCs) integrally formed with said substrate, each of said FTCs being uniquely associated with a one of said FTIs and being configured to select among operational modes of said associated one of said FTIs; and
an input/output controller (IOC) and common test bus integrally formed with said substrate, said common test bus being dedicated to providing signaling for enablement of testing, said common test bus being separate from a data bus, said IOC being connected to each of said FTCs via said common test bus to transmit individually addressed commands to each of said FTCs said IOC further being connected to exchange signals with an external device.

8. The integrated circuit of claim 7 wherein each of said FTIs is configured to operate in a plurality of alternative said operational modes, including a normal-operation mode in which data is transmitted between said core circuitry and said associated one of said SERDESs via each of said FTIs.

9. The integrated circuit of claim 7 wherein each of said FTIs includes a pattern generator connected to said parallel data inputs of said associated one of said SERDESs and includes an error detector connected to said parallel data outputs of said associated one of said SERDESs.

10. The integrated circuit of claim 7 further comprising a built-in-self-tester (BIST) integrally formed on said substrate, said BIST being connected and configured to activate testing via said FTIs.

11. The integrated circuit of claim 7 wherein each of said FTIs is connected to said IOC via a common test bus, said FTIs also being connected to said core circuitry.

12. The integrated circuit of claim 11 wherein each of said FTIs is assigned a unique address, said IOC being enabled to individually manipulate each of said FTIs by employing said unique addresses.

13. A method of testing operations of serializer/descrializers (SERDESs) of an integrated circuit comprising the steps of:
embedding a plurality of test interfaces within said integrated circuit such that each of said test interface is specific to a one of said SERDESs with respect to exchanging parallel data, including forming each of said test interfaces to include a test pattern generator connected to parallel data inputs of said SERDESs to which each of said test interfaces is specific and further including forming each of said test interfaces to include an error detector to receive parallel data from said SERDESs to which said test interface is specific, wherein each of said SERDESs is individually and concurrently tested and a bit error rate of each of said SERDESs is individually identified, and wherein said testers perform loop-back testing, static data testing and dynamic data testing;

embedding test controllers within said integrated circuit such that each of said test controllers is specific to a one of said test interfaces with respect to triggering test operations by said one of said test interfaces;

providing an integrated circuit output that enables said test controllers to be individually addressed; and embedding an input/output controller (IOC) and a test bus within said integrated circuit, including connecting said IOC between said integrated circuit output and said test bus and including linking each said test controller to said test bus, said test bus being separate from a data bus.

14. The method of claim 13 further comprising a stop of concurrently enabling all of said test interfaces to simultaneously monitor performances of said SERDESs.

15. The method of claim 13 further comprising the step of embedding a built-in-self-test (BIST) state machine within said integrated circuit such that said BIST is connected to each of said test controllers.

16. The method of claim 13 further comprising the step of forming an insulative package to house circuitry of said integrated circuit.

* * * * *

UNITED STATES PATENT AND TRADEMARK OFFICE
CERTIFICATE OF CORRECTION

PATENT NO. : 7,343,535 B2 Page 1 of 1
APPLICATION NO. : 10/068326
DATED : March 11, 2008
INVENTOR(S) : Benny W. H. Lai It is certified that error appears in the above-identified patent and that said Letters Patent is hereby corrected as shown below:

Title page, Column 1, item [73] (Assignee), Line 1, delete "Dte" and insert -- Pte --;

Column 7, Line 64, Claim 5, after "SERDESs" insert -- and --;

Column 8, Line 22, Claim 7, delete "reform" and insert -- perform --;

Column 8, Line 36, Claim 7, after "FTCs" insert -- , --;

Column 8, Lines 59-60, Claim 13, delete "descrializers" and insert -- deserializers --;

Column 8, Line 63, Claim 13, delete "interface" and insert -- interfaces --.

Signed and Sealed this

Eighth Day of June, 2010

David J. Kappos
*Director of the United States Patent and Trademark Office*